United States Patent
Jiang

(10) Patent No.: US 12,237,338 B2
(45) Date of Patent: Feb. 25, 2025

(54) ARRAY SUBSTRATE, METHOD FOR MANUFACTURING ARRAY SUBSTRATE, AND DISPLAY PANEL

(71) Applicant: TCL CHINA STAR OPTOELECTRONICS TECHNOLOGY CO., LTD., Shenzhen (CN)

(72) Inventor: Zhixiong Jiang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 559 days.

(21) Appl. No.: 17/600,254

(22) PCT Filed: Aug. 30, 2021

(86) PCT No.: PCT/CN2021/115291
§ 371 (c)(1),
(2) Date: Sep. 30, 2021

(87) PCT Pub. No.: WO2023/015620
PCT Pub. Date: Feb. 16, 2023

(65) Prior Publication Data
US 2023/0215872 A1    Jul. 6, 2023

(30) Foreign Application Priority Data

Aug. 9, 2021  (CN) .......................... 202110906207.5

(51) Int. Cl.
*H01L 27/12* (2006.01)
*H01L 29/786* (2006.01)

(52) U.S. Cl.
CPC ...... *H01L 27/124* (2013.01); *H01L 29/78645* (2013.01); *H01L 27/1218* (2013.01);
(Continued)

(58) Field of Classification Search
CPC ......... H01L 29/78645; H01L 29/78648; H01L 27/124
See application file for complete search history.

(56) References Cited

U.S. PATENT DOCUMENTS 5,453,856 A * 9/1995 Kim ..................... G02F 1/1368
                                                                349/143
2003/0169381 A1* 9/2003 Kawachi ........... H01L 29/78645
                                                                349/43
(Continued)

FOREIGN PATENT DOCUMENTS

CN         1971387 A        5/2007
CN         102681274 A      9/2012
(Continued)

OTHER PUBLICATIONS

PCT International Search Report for International Application No. PCT/CN2021/115291, mailed on May 9, 2022, 6pp.
(Continued)

*Primary Examiner* — Peter M Albrecht
(74) *Attorney, Agent, or Firm* — The Roy Gross Law Firm, LLC; Roy Gross

(57) ABSTRACT

An array substrate, a method for manufacturing an array substrate, and a display panel are provided. The array substrate includes a substrate and a thin film transistor layer arranged on the substrate. The thin film transistor layer includes a plurality of thin film transistors. The thin film transistors each include an active layer, a source/drain, a first gate, a second gate, and a first insulating layer. The first gate and the second gate are electrically connected through the through hole. The problems of difficulty in etching and excessively long etching time are avoided while reducing the gate resistance of the thin film transistor.

18 Claims, 2 Drawing Sheets

(52) U.S. Cl.
CPC ...... *H01L 27/1222* (2013.01); *H01L 27/1237* (2013.01); *H01L 27/127* (2013.01)

(56) References Cited

U.S. PATENT DOCUMENTS

| | | | | |
|---|---|---|---|---|
| 2007/0117239 | A1* | 5/2007 | Ishi | ........................ H01L 27/124 438/30 |
| 2013/0057459 | A1* | 3/2013 | Kuo | .................. G02F 1/136286 345/84 |
| 2017/0207345 | A1* | 7/2017 | Shi | .................... H01L 29/78645 |
| 2018/0033808 | A1 | 2/2018 | Li | |
| 2019/0386027 | A1* | 12/2019 | Zhang | .................. H01L 27/124 |
| 2021/0327909 | A1* | 10/2021 | Yan | ........................ H01L 27/124 |

FOREIGN PATENT DOCUMENTS

| CN | 104505391 | A | 4/2015 |
|---|---|---|---|
| CN | 105161496 | A | 12/2015 |
| CN | 205427404 | U | 8/2016 |
| CN | 107481938 | A | 12/2017 |
| CN | 109254461 | A | 1/2019 |
| CN | 111029345 | A | 4/2020 |
| CN | 111192884 | A | 5/2020 |
| CN | 111628004 | A | 9/2020 |

OTHER PUBLICATIONS

PCT Written Opinion of the International Searching Authority for International Application No. PCT/CN2021/115291, mailed on May 9, 2022, 8pp.

Chinese Office Action issued in corresponding Chinese Patent Application No. 202110906207.5 dated Mar. 29, 2024, pp. 1-10, 21pp.

Chinese Office Action issued in corresponding Chinese Patent Application No. 202110906207.5 dated Nov. 30, 2024, pp. 1-10.

* cited by examiner

ARRAY SUBSTRATE, METHOD FOR MANUFACTURING ARRAY SUBSTRATE, AND DISPLAY PANEL

CROSS REFERENCE TO RELATED APPLICATIONS

This application is a National Phase of PCT Patent Application No. PCT/CN2021/115291 having International filing date of Aug. 30, 2021, which claims the benefit of priority of Chinese Application No. 202110906207.5 filed on Aug. 9, 2021. The contents of the above applications are all incorporated by reference as if fully set forth herein in their entirety.

BACKGROUND

Technical Field

This application relates to the field of display technology, and specifically to an array substrate, a method for manufacturing an array substrate, and a display panel.

Related Art

Thin film transistor (TFT) liquid crystal display (LCD) panels have the advantages of small volume and high contrast, and are widely applied to electronic products such as mobile phones, televisions, and computers. A TFT generally includes a gate, a source/drain, and an active layer. As the demand for resolution increases, the proportion of the gate in the TFT becomes larger and larger. Consequently, the resistance-capacitance delay (RC delay) is increased many times, which in turn leads to an excessively high wrong charging voltage, resulting in abnormal displaying.

SUMMARY

Technical Problem

This application provides an array substrate, a method for manufacturing an array substrate, and a display panel, to solve the problem that an excessively high resistance-capacitance delay in a conventional array substrate resulting in an excessively high wrong charging voltage and abnormal displaying.

Technical Solution

According to a first aspect, this application provides an array substrate. The array substrate includes:

a substrate;

a thin film transistor layer, arranged on the substrate, wherein the thin film transistor layer includes a plurality of thin film transistors, the thin film transistors each include an active layer, a source/drain electrically connected to the active layer, and a first gate and a second gate corresponding to the active layer, a first insulating layer is arranged between the first gate and the second gate, a through hole is formed on the first insulating layer, and the first gate and the second gate are electrically connected through the through hole.

Optionally, the thin film transistor layer includes a first gate line and a data line, the first gate line is electrically connected to and arranged in the same layer as the first gate electrode, and the data line is electrically connected to and arranged in the same layer as the source/drain; and the first gate line and the data line are arranged in a staggered manner.

Optionally, the thin film transistor layer comprises a second gate line, where the second gate line is electrically connected to and arranged in the same layer as the second gate, and the second gate line intersects the data line; and the first gate line and the second gate line at least partially overlap, and the first gate line breaks at the intersection between the second gate line and the data line.

Optionally, a second insulating layer is arranged between the first gate and the active layer; and the second gate line, the first insulating layer, the first gate line, the second insulating layer, the active layer, and the data line are stacked on the substrate, and the first gate corresponds to the position of the active layer.

Optionally, a second insulating layer is arranged between the second gate and the active layer; and the active layer, the second insulating layer, the second gate line, the first insulating layer, the first gate line, and the data line are sequentially stacked on the substrate, and the second gate corresponds to the position of the active layer.

Optionally, the second insulating layer is a gate insulating layer in the thin film transistor.

Optionally, a thickness of the first insulating layer is greater than or equal to a thickness of the second insulating layer.

Optionally, a sum of the thicknesses of the first insulating layer and the second insulating layer is at least twice the thickness of the second insulating layer.

Optionally, a thickness of the first gate line is greater than or equal to a thickness of the second gate line.

Optionally, the through hole corresponds to the position of the first gate.

Optionally, an orthographic projection of the through hole along a thickness direction of the array substrate is located on the first gate.

Optionally, a material of the first insulating layer includes silicon oxide or silicon nitride.

Optionally, a material of the active layer includes one of amorphous silicon, microcrystalline silicon, polysilicon, or a metal oxide.

Optionally, a material of the substrate includes glass or resin.

According to a second aspect, this application provides a method for manufacturing an array substrate, comprising the following steps:

providing a substrate;

preparing a second gate and a second gate line on the substrate, wherein the second gate and the second gate line are electrically connected and arranged in the same layer;

preparing a first insulating layer on the second gate and the second gate line, and forming a through hole on the first insulating layer;

preparing a first gate and a first gate line on the first insulating layer, and electrically connecting the first gate to the second gate through the through hole, wherein the first gate line and the first gate are electrically connected and arranged in the same layer;

preparing a second insulating layer on the first gate and the first gate line;

preparing an active layer on the second insulating layer; and preparing a source/drain and a data line on the active layer, wherein the data line is electrically connected to and arranged in the same layer as a source in the source/drain.

Optionally, the preparing a second gate and a second gate line on the substrate includes:

depositing a metal layer on the substrate; and patterning the metal layer to forms the second gate and the second gate line.

Optionally, the preparing a first gate and a first gate line on the first insulating layer includes:

depositing a metal layer on the first insulating layer; and patterning the metal layer to forms the first gate and the first gate line.

Optionally, the first gate line is provided with a partition region, and the step of preparing a source/drain and a data line on the active layer includes:

depositing a metal layer on the active layer; and patterning the metal layer to form the source/drain and the data line, wherein the data line and the partition region at least partially overlap.

Optionally, a material of the metal layer is copper or aluminum.

According to a third aspect, this application provides a display panel, comprising an array substrate according to the embodiments of this application.

Beneficial Effects

This application provides an array substrate, a method for manufacturing an array substrate, and a display panel. The array substrate includes a substrate and a thin film transistor layer arranged on the substrate. The thin film transistor layer includes a plurality of thin film transistors. Each of the thin film transistors includes an active layer, a source/drain electrically connected to the active layer, and a first gate and a second gate corresponding to the active layer. A first insulating layer is arranged between the first gate and the second gate. A through hole is formed on the first insulating layer. The first gate and the second gate are electrically connected through the through hole. By stacking the first gate and the second gate in the array substrate and electrically connecting the first gate and the second gate, the thickness of the gate of the thin film transistor is increased and the gate resistance is reduced, thereby solving the problem that an excessively high resistance-capacitance delay in a conventional array substrate leads to an excessively high wrong charging voltage and abnormal displaying.

BRIEF DESCRIPTION OF THE DRAWINGS

The following describes specific implementations of this application in detail with reference to the accompanying drawings, to make the technical solutions and other beneficial effects of this application obvious.

Figure 1:
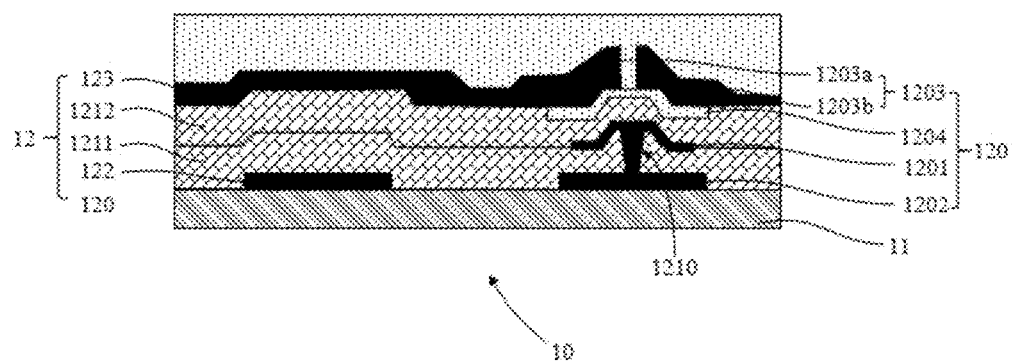
FIG. 1 is a schematic structural diagram of an array substrate according to a first embodiment of this application.

| Reference numeral | Name of Component | Reference numeral | Name of Component |
|---|---|---|---|
| 10 | array substrate | 11 | substrate |
| 12 | thin film transistor layer | 120 | thin film transistor |
| 1201 | first gate | 1202 | second gate |
| 1203 | source/drain | 1204 | active layer |
| 121 | first gate line | 122 | second gate line |
| 123 | data line | 1211 | first insulating layer |
| 1212 | second insulating layer | 1210 | through hole |
| 1203a | source | 1203b | drain |
| 1213 | partition region | | |

DETAILED DESCRIPTION

The technical solutions in the embodiments of this application are clearly and completely described below with reference to the accompanying drawings in the embodiments of this application. Apparently, the described embodiments are merely some rather than all of the embodiments of this application. All other embodiments obtained by a person skilled in the art based on the embodiments of this application without creative efforts shall fall within the protection scope of this application. In addition, it should be understood that the specific implementations described herein are merely used for describing and illustrating this application, but are not intended to limit this application. In this application, without the contrary explanation, the directional terms such as "above" and "below" generally refer to "above" and "below" in actual use or a working state of a device, and specifically refer to drawing directions of the corresponding accompanying drawings; and "inside" and "outside" are relative to the contour of the device.

Figure 2:
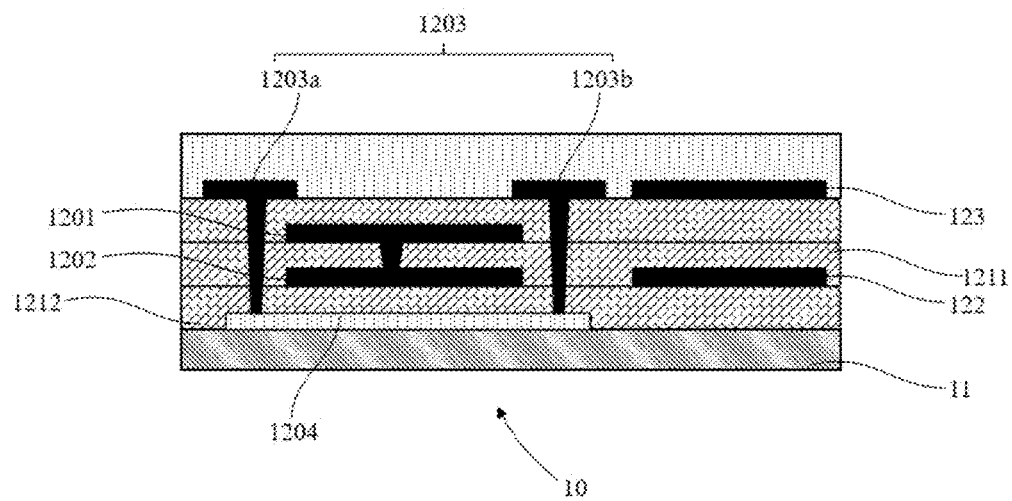
FIG. 2 is a schematic structural diagram of an array substrate according to a second embodiment of this application.

First, this application provides an array substrate 10. Referring to FIG. 1 and FIG. 2, the array substrate 10 includes a substrate 11 and a thin film transistor layer 12 arranged on the substrate 11. The thin film transistor layer 12 includes a plurality of thin film transistors 120. The thin film transistors 120 are main components of the array substrate 10 and are configured to control on/off of pixels. It is to be understood that the number of thin film transistors 120 may be determined according to actual situations and is not limited herein.

The thin film transistors 120 each include an active layer 1204, a source/drain 1203 electrically connected to the active layer 1204, and a first gate 1201 and a second gate 1202 corresponding to active layer 1204. The source/drain 1203 includes a source 1203a and a drain 1203b. The first gate 1201 and the second gate 1202 are stacked at a distance from each other. A first insulating layer 1211 is arranged between the first gate 1201 and the second gate 1202. A through hole 1210 is formed on the first insulating layer 1211. The first gate 1201 and the second gate 1202 are electrically connected through the through hole 1210.

To reduce the resistance-capacitance delay (RC delay) of the gate drive signal, it is necessary to reduce the resistance of the gate in the thin film transistor 120. In the related art, the resistance of the gate is generally reduced by increasing the gate thickness and using copper as the gate material. During preparation of the gate, generally a metal layer is deposited first and then patterned and etched. However, copper is difficult to etch, and the etching time and difficulty are increased especially when the gate thickness is increased, resulting in increased manufacturing costs of the array substrate 10.

By stacking the first gate 1201 and the second gate 1202 in the thin film transistor 120 of the array substrate 10, two metal layers can be successively deposited in the process and the two metal layers are etched to form the first gate 1201 and the second gate 1202 respectively. Compared with the method of etching one thick metal layer to form a gate, the preparation time is reduced, and the etching difficulty is lowered. In addition, because the first insulating layer 1201 is arranged between the first gate 1201 and the second gate 1202, and the first gate 1201 and the second gate 1202 are electrically connected through the through hole 1210 on the first insulating layer 1211, which is equivalent to increasing the thickness of the gate in the thin film transistor 120 and reducing the gate resistance, the resistance-capacitance delay of the gate drive signal is reduced.

The material of the first insulating layer 1211 can be a material with good insulating properties such as silicon oxide or silicon nitride. The through hole 1210 can be formed on the first insulating layer 1211 by lithography. It is to be noted that the position of the through hole 1210 may be determined according to actual situations and is not limited herein.

Because the first gate 1201 is connected to the second gate 1202 through the through hole 1210, the position of the through hole 1210 determines the wiring mode of the first gate 1201 and the connectivity between the first gate 1201 and the second gate 1202. Preferably, referring to FIG. 1 and FIG. 2, in an embodiment of this application, the through hole 1210 corresponds to the position of the first gate 1201, which means that an orthographic projection of the through hole 1210 along the thickness of the array substrate 10 entirely falls on the first gate 1201. The through hole 1210 runs through the first insulating layer 1211 and extends to the second gate 1202 so that the first gate 1201 can be connected to the second gate 1202 through the through hole 1210. In this way, the wiring of the first gate 1201 is simplified, and a good connection between the first gate 1201 and the second gate 1202 can be ensured.

Figure 3:
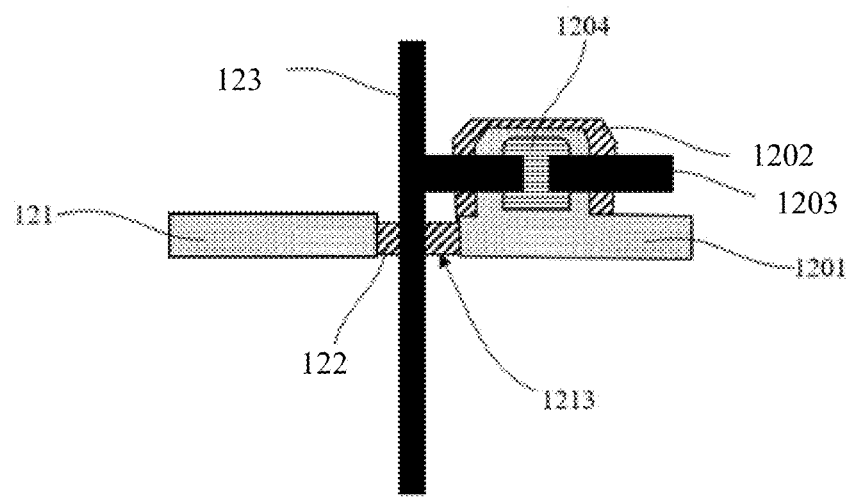
FIG. 3 is a schematic structural plane view of an array substrate according to an embodiment of this application.

Referring to FIG. 1, FIG. 2, and FIG. 3, in an embodiment of this application, the thin film transistor layer 12 includes a first gate line 121 and a data line 123, the first gate line 121 is electrically connected to and arranged in the same layer as the first gate 1201, the data line 123 is electrically connected to and arranged in the same layer as the source/drain 1203, and the first gate line 121 and the data line 123 are arranged in a staggered manner. The thin film transistor layer 12 further includes a second gate line 122, and the second gate line 122 is electrically connected to and arranged in the same layer as the second gate 1202.

The arrangement of the first gate line 121 and the data line 123 in a staggered manner can prevent the formation of a parasitic capacitance when the first gate line 121 overlaps the data line 123, and helps reduce the resistance-capacitance delay of the array substrate 10.

In the manufacturing process of the array substrate 10, a metal layer may be formed on the substrate 11 by a physical vapor deposition process or a chemical vapor deposition process, and the metal layer is patterned using a photomask process to obtain the first gate 1201 and the first gate line 121. Similarly, in the manufacturing process of the second gate layer 1202 and the second gate line 122 and that of the source/drain 1203 and the data line 123, the method of depositing a metal layer first and then patterning the metal layer may also be adopted. The deposited metal layer may adopt a material having good electrical conductivity such as copper or aluminum.

It is to be noted that in order to stagger the first gate line 121 from the data line 123, the first gate line 121 needs to be etched to form, on the first gate 1201, a hollow region staggered from the data line 123. Referring to FIG. 1, FIG. 2 and FIG. 3, the second gate line 122 intersects the data line 123, the first gate line 121 and the second gate line 122 at least partially overlap, and first gate line 121 breaks at the intersection between the second gate line 122 and the data line 123, so that the first gate line 121 is staggered from the data line 123. With the design that the first gate line 121 breaks at the intersection between the second gate line 122 and the data line 123, that is, the first gate line 121 is hollowed at the intersection between the second gate line 122 and the data line 123, only the part of the first gate line 121 at the intersection between the second gate line 122 and the data line 123 needs to be hollowed during etching, which simplifies the process.

Combining FIG. 1 and FIG. 2, the thin film transistor layer 12 includes the first insulating layer 1211 and a second insulating layer 1212. The second insulating layer 1212 serves as a gate insulating layer in the thin film transistor 120, to insulate the first gate 1201 or the second gate 1202 from the active layer 1204. The second gate line 122, the first insulating layer 1211, the first gate line 121, the second insulating layer 1212, the active layer 1204, and the data line 123 are stacked on the substrate 11, and the first gate 1201 corresponds to the position of the active layer 1204.

Because the first gate line 121 is staggered from the data line 123 and the second gate line 122 is staggered from and overlaps the data line 123, a parasitic capacitance in the thin film transistor 120 is formed between the second gate line 122 and the data line 123. With the arrangement of the first insulating layer 1211 and the second insulating layer 1212, the second gate line 122 and the data line 123 are separated by two insulating layers, so that the thickness of the insulating layer between the second gate line 122 and the data line 123 is increased. Therefore, the capacitance generated by the second gate line 122 and the data line 123 in the overlapping region can be reduced, thereby reducing the resistance-capacitance delay of the array substrate 10.

It is to be noted that the positions of the first gate 1201, the second gate 1202, the active layer 1204, and the source/drain 1203 relative to each other may be determined according to actual situations. As shown in FIG. 2, a second insulating layer 1212 is arranged between the second gate 1202 and the active layer 1204. The active layer 1204, the second insulating layer 1212, the second gate line 122, the first insulating layer 1211, the first gate line 121, and the data line 123 are sequentially stacked on the substrate 11, and the second gate 1202 corresponds to the position of the active layer 1204.

Preferably, as shown in FIG. 1, a second insulating layer 1212 is arranged between the first gate 1201 and the active layer 1204. The second gate line 122, the first insulating layer 1211, the first gate line 121, the second insulating layer 1212, the active layer 1204, and the data line 123 are stacked on the substrate 11, and the first gate 1201 corresponds to the position of the active layer 1204. In this way, the first gate 1201 and the second gate 1202 can shield the active layer 1204, so as to prevent back light from irradiating the active layer 1204 to affect the performance of the thin film transistor 120.

It is to be understood that the thicknesses of the first insulating layer 1211 and the second insulating layer 1212 may be determined according to actual situations. Preferably, the thickness of the first insulating layer 1211 is greater than or equal to the thickness of the second insulating layer 1212, and the sum of the thicknesses of the first insulating layer 1211 and the second insulating layer 1212 is at least twice the thickness of the second insulating layer 1212. That is to say, the capacitance between the second gate line 122 and the data line 123 can be reduced by increasing the thickness of the first insulating layer 1211 in the manufacturing process of the array substrate 10, thereby avoiding the impact on the performance of the thin film transistor 120 caused by increasing the thickness of the second insulating layer 1212.

Figure 4:
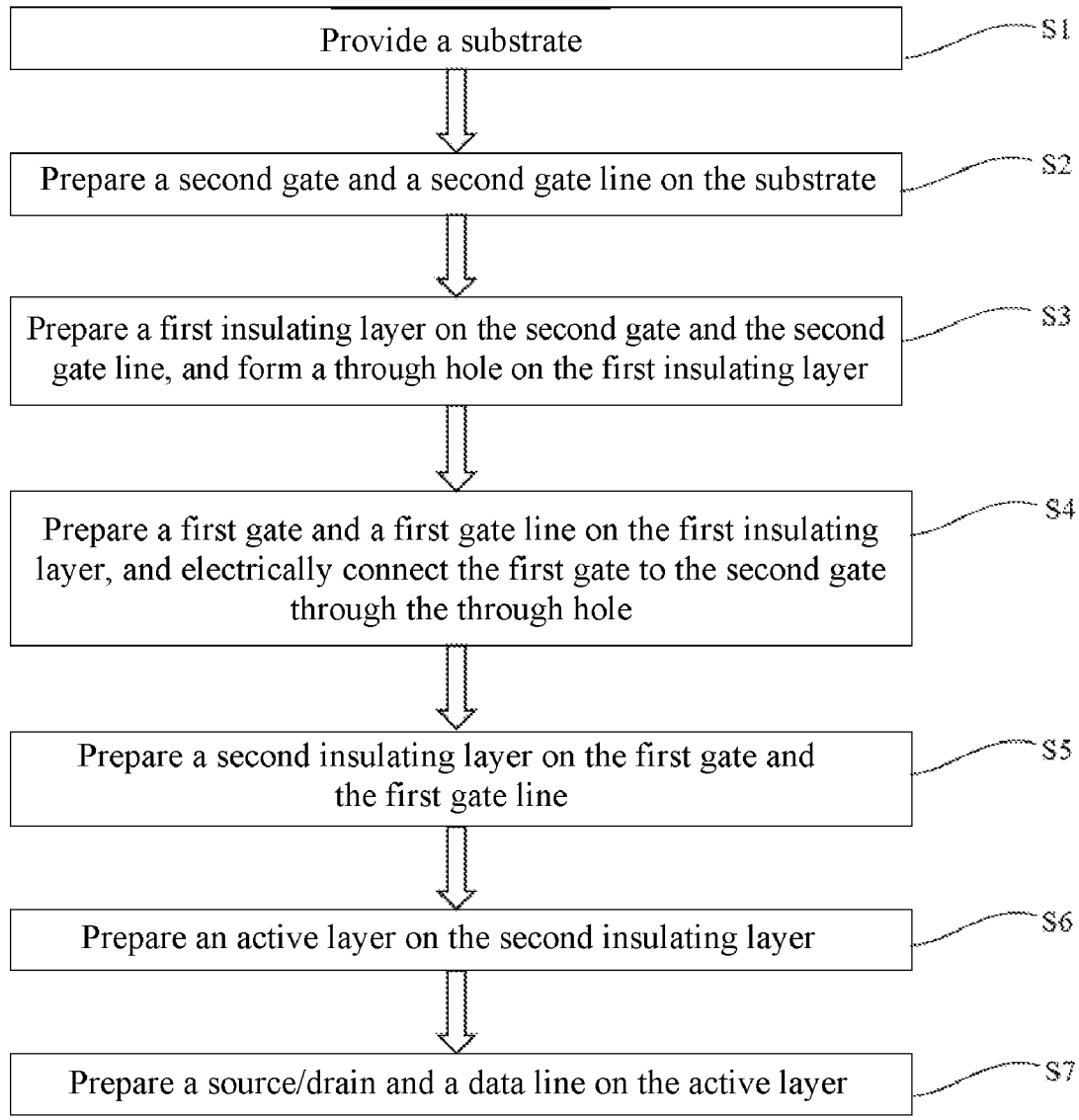
FIG. 4 is a flowchart of a method for manufacturing an array substrate according to an embodiment of this application.

According to another aspect, this application provides a method for manufacturing an array substrate 10. As shown in FIG. 4, the method includes the following steps:

S1, providing a substrate 11;

S2, preparing a second gate 1202 and a second gate line 122 on the substrate 11, wherein the second gate 1202 and the second gate line 122 are electrically connected and arranged in the same layer;

S3, preparing a first insulating layer 1211 on the second gate 1202 and the second gate line 122, and forming a through hole 1210 on the first insulating layer 1211;

S4, preparing a first gate 1201 and a first gate line 121 on the first insulating layer 1211, and electrically connecting the first gate 1201 to the second gate 1202 through the through hole 1210, wherein the first gate line 121 and the first gate 1201 are electrically connected and arranged in the same layer;

S5, preparing a second insulating layer 1212 on the first gate 1201 and the first gate line 121;

S6, preparing an active layer 1204 on the second insulating layer 1212; and

S7, preparing a source/drain 1203 and a data line 123 on the active layer 1204, wherein the data line 123 is electrically connected to and arranged in the same layer as a source 1203a in the source/drain 1203, and the data line 123 intersects the second gate line 122.

First, a substrate 11 is provided. The material of the substrate 11 may be glass or resin, which is not limited herein. A second gate 1202 and a second gate line 122 are then prepared on the substrate 11. In an embodiment of this application, a metal layer may be formed on the substrate 11 by a physical vapor deposition process or a chemical vapor deposition process, and then the metal layer is patterned using a photomask process to obtain the second gate 1202 and the second gate line 122. The metal layer may adopt a material having good electrical conductivity such as copper or aluminum, which may be determined according to actual situations.

After the second gate 1202 and the second gate line 122 are prepared, a first insulating layer 1211 is prepared on the second gate 1202 and the second gate line 122 by a physical vapor deposition method, a chemical vapor deposition method, or a coating method, and a through hole 1210 is formed on the first insulating layer 1211. The material of the first insulating layer 1211 may be silicon dioxide or silicon nitride, and a process for forming the through hole 1210 includes photolithography or laser etching, which may be determined according to actual situations.

Next, a first gate 1201 and a first gate line 121 are prepared on the first insulating layer 1211, and the first gate 1201 is electrically connected to the second gate 1202 through the through hole 1210. A metal layer may be formed on the first insulating layer 1211 by a physical vapor deposition process or a chemical vapor deposition process, and then the metal layer is patterned using a photomask process to obtain the first gate 1201 and the first gate line 121.

It is to be noted that in the process of preparing the first gate 1201 and the first gate line 121, referring to FIG. 3, a partition region 1213 is arranged on the first gate line 121, so that the data line 123 and the first gate line 121 can be staggered from each other in the subsequent process of preparing the data line 123.

After the first gate 1201 and the first gate line 121 are prepared, a second insulating layer 1212 is prepared on the first gate 1201 and the first gate line 121 by a physical vapor deposition method, a chemical vapor deposition method, or a coating method. Then, an active layer 1204 is prepared on the second insulating layer 1212. The active layer 1204 may adopt a semiconductor material such as amorphous silicon, microcrystalline silicon, polycrystalline silicon, or a metal oxide.

Figure 5:
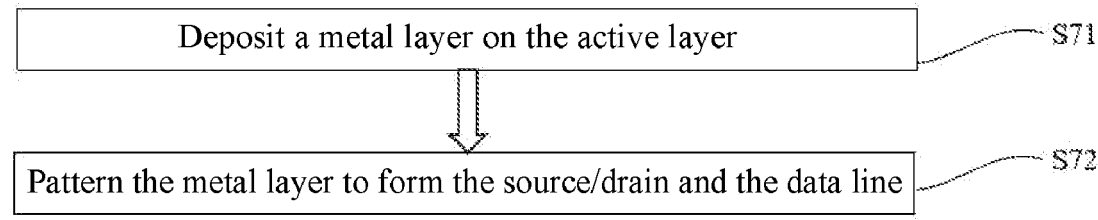
FIG. 5 is a schematic flowchart of step S4 in FIG. 4.

Preferably, as shown in FIG. 5, step S7 further includes:

S71, depositing a metal layer on the active layer 1204; and

S72, patterning the metal layer to form the source/drain 1203 and the data line 123, wherein the data line 123 and the partition region 1213 at least partially overlap.

A metal layer is deposited on the active layer 1204, and the metal layer is then patterned and etched to form the source/drain 1203 and the data line 123, so that wiring of the data line 123 is located within the partition region 1213 on the first gate line 121. That is to say, the data line 123 is staggered from the first gate line 121, to ensure that the parasitic capacitance between the gate line and the data line 123 is generated by the overlapping of the second gate line 122 with the data line 123. Therefore, the parasitic capacitance between the second gate line 122 and the data line 123 can be reduced by arranging two insulating layers without affecting the performance of the thin film transistor 120.

An array substrate, a method for manufacturing an array substrate, and a display panel provided in the embodiments of this application are described above in detail. Although the principles and implementations of this application are described by using specific examples in this specification, the descriptions of the foregoing embodiments are merely used for helping understand the technical solutions and the core idea of the technical solutions of this application. A person of ordinary skill in the art should understand that modifications may be still made to the technical solutions described in the foregoing embodiments or equivalent replacements may be made to some technical features thereof, as long as such modifications or replacements do not make the essence of corresponding technical solutions depart from the scope of the technical solutions of the embodiments of this application.

What is claimed is:

1. An array substrate, comprising:
a substrate;
a thin film transistor layer, arranged on the substrate, wherein the thin film transistor layer comprises a plurality of thin film transistors, the thin film transistors each comprise an active layer, a source/drain electrically connected to the active layer, and a first gate and a second gate corresponding to the active layer, a first insulating layer is arranged between the first gate and the second gate, a through hole is formed in the first insulating layer, and the first gate and the second gate are electrically connected through the through hole;
wherein the thin film transistor layer comprises a first gate line and a data line, the first gate line is electrically connected to and arranged in the same layer as the first gate, and the data line is electrically connected to and arranged in the same layer as the source/drain; wherein the first gate line is provided with a partition region separating the first gate line from the first gate, the data line and the partition region at least partially overlap, and the first gate line and the data line are arranged in a staggered manner;

wherein the thin film transistor layer comprises a second gate line, where the second gate line is electrically connected to and arranged in the same layer as the second gate, and the second gate line intersects the data line;

the first gate line and the second gate line at least partially overlap; and the first gate line breaks at the partition region that overlaps the intersection between the second gate line and the data line.

2. The array substrate according to claim 1, wherein a second insulating layer is disposed between the first gate and the active layer; and the second gate line, the first insulating layer, the first gate line, the second insulating layer, the active layer, and the data line are stacked on the substrate, and the first gate corresponds to the position of the active layer.

3. The array substrate according to claim 1, wherein a second insulating layer is disposed between the second gate and the active layer; and the active layer, the second insulating layer, the second gate line, the first insulating layer, the first gate line, and the data line are sequentially stacked on the substrate, and the second gate corresponds to the position of the active layer.

4. The array substrate according to claim 3, wherein the second insulating layer is a gate insulating layer in the thin film transistor.

5. The array substrate according to claim 2, wherein a thickness of the first insulating layer is greater than or equal to a thickness of the second insulating layer.

6. The array substrate according to claim 5, wherein a sum of the thicknesses of the first insulating layer and the second insulating layer is at least twice the thickness of the second insulating layer.

7. The array substrate according to claim 1, wherein a thickness of the first gate line is greater than or equal to a thickness of the second gate line.

8. The array substrate according to claim 1, wherein the through hole corresponds to the position of the first gate.

9. The array substrate according to claim 8, wherein an orthographic projection of the through hole along a thickness direction of the array substrate is located on the first gate.

10. The array substrate according to claim 1, wherein a material of the first insulating layer comprises silicon oxide or silicon nitride.

11. The array substrate according to claim 1, wherein a material of the active layer comprises one of amorphous silicon, microcrystalline silicon, polysilicon, or a metal oxide.

12. The array substrate according to claim 1, wherein a material of the substrate comprises glass or resin.

13. A method for manufacturing an array substrate, comprising following steps:
 providing a substrate;
 preparing a thin film transistor layer on the substrate, wherein the thin film transistor layer comprises a plurality of thin film transistors, wherein the preparing a thin film transistor layer on the substrate comprises:
 preparing a second gate and a second gate line on the substrate, wherein the second gate and the second gate line are electrically connected and arranged in the same layer;
 preparing a first insulating layer on the second gate and the second gate line, and forming a through hole in the first insulating layer;
 preparing a first gate and a first gate line on the first insulating layer, and electrically connecting the first gate to the second gate through the through hole, wherein the first gate line and the first gate are electrically connected and arranged in the same layer; and the first gate line and the second gate line at least partially overlap;
 preparing a second insulating layer on the first gate and the first gate line;
 preparing an active layer on the second insulating layer, wherein the first gate and the second gate correspond to the active layer; and
 preparing a source/drain and a data line on the active layer, wherein the data line is electrically connected to and arranged in the same layer as a source in the source/drain; the source/drain is electrically connected to the active layer; the first gate line is provided with a partition region separating the first gate line from the first gate, the data line and the partition region at least partially overlap, and the first gate line and the data line are arranged in a staggered manner; the data line and the second gate line are intersected at a position overlapping the partition region, and the first gate line breaks at the partition region that overlaps the intersection between the second gate line and the data line.

14. The method for manufacturing an array substrate according to claim 13, wherein the preparing a second gate and a second gate line on the substrate comprises:
 depositing a metal layer on the substrate; and
 patterning the metal layer to form the second gate and the second gate line.

15. The method for manufacturing an array substrate according to claim 13, wherein the preparing a first gate and a first gate line on the first insulating layer comprises:
 depositing a metal layer on the first insulating layer; and
 patterning the metal layer to form the first gate and the first gate line.

16. The method for manufacturing an array substrate according to claim 13, wherein the step of preparing a source/drain and a data line on the active layer comprises:
 depositing a metal layer on the active layer; and
 patterning the metal layer to form the source/drain and the data line.

17. The method for manufacturing an array substrate according to claim 14, wherein a material of the metal layer is copper or aluminum.

18. A display panel, comprising an array substrate comprising:
 a substrate;
 a thin film transistor layer, arranged on the substrate, wherein the thin film transistor layer comprises a plurality of thin film transistors, the thin film transistors each comprise an active layer, a source/drain electrically connected to the active layer, and a first gate and a second gate corresponding to the active layer, a first insulating layer is arranged between the first gate and the second gate, a through hole is formed in the first insulating layer, and the first gate and the second gate are electrically connected through the through hole;
 wherein the thin film transistor layer comprises a first gate line and a data line, the first gate line is electrically connected to and arranged in the same layer as the first gate, and the data line is electrically connected to and arranged in the same layer as the source/drain; wherein the first gate line is provided with a partition region separating the first gate line from the first gate, the data line and the partition region at least partially overlap, and the first gate line and the data line are arranged in a staggered manner;

wherein the thin film transistor layer comprises a second gate line, where the second gate line is electrically connected to and arranged in the same layer as the second gate, and the second gate line intersects the data line;

the first gate line and the second gate line at least partially overlap; and the first gate line breaks at the partition region that overlaps the intersection between the second gate line and the data line.

\* \* \* \* \*